(12) United States Patent
Shin et al.

(10) Patent No.: US 11,917,848 B2
(45) Date of Patent: Feb. 27, 2024

(54) PROTECTIVE WINDOW INCLUDING PROTECTED EDGE GLASS SUBSTRATE

(71) Applicant: Samsung Display Co., LTD., Yongin-si (KR)

(72) Inventors: Jai Ku Shin, Hwaseong-si (KR); Dong Jin Park, Seongnam-si (KR); Dongwoo Seo, Suwon-si (KR); Sung Chul Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/950,462

(22) Filed: Sep. 22, 2022

(65) Prior Publication Data
US 2023/0018300 A1    Jan. 19, 2023

Related U.S. Application Data

(62) Division of application No. 16/987,474, filed on Aug. 7, 2020, now Pat. No. 11,482,690.

(30) Foreign Application Priority Data

Aug. 27, 2019  (KR) .......................... 10-2019-0105197

(51) Int. Cl.
*H10K 50/84*   (2023.01)
*H10K 50/86*   (2023.01)
(Continued)

(52) U.S. Cl.
CPC ........... *H10K 50/841* (2023.02); *H10K 50/86* (2023.02); *H10K 59/12* (2023.02); *H10K 59/40* (2023.02);
(Continued)

(58) Field of Classification Search
CPC .... H10K 50/841; H10K 50/86; H10K 50/868; H10K 50/844; H10K 50/8426;
(Continued)

(56) References Cited

U.S. PATENT DOCUMENTS 6,134,851 A * 10/2000 Roze .................. B60J 10/70
                                            52/204.67
6,249,509 B1 * 6/2001 Hirata ................ G11B 7/24097
(Continued)

FOREIGN PATENT DOCUMENTS

KR        101437901 B1   8/2014
KR     1020170001844 A   1/2017
(Continued)

*Primary Examiner* — Ida M Soward
(74) *Attorney, Agent, or Firm* — CANTOR COLBURN LLP

(57) ABSTRACT

A protective window includes a glass substrate which faces a display surface of an image-generating panel and has a thickness of about 20 micrometers to about 80 micrometers; a protective film which faces the display surface of the image-generating panel with the glass substrate therebetween; an adhesive layer which is between the protective film and the glass substrate and combines the protective film with the glass substrate; and a protective layer which covers an edge portion of the glass substrate. A thickness of the protective layer which covers the edge portion of the glass substrate is equal to or less than about ⅓ of a thickness of the adhesive layer which combines the protective film with the glass substrate.

10 Claims, 9 Drawing Sheets

(51) Int. Cl.
*H10K 59/12* (2023.01)
*H10K 59/40* (2023.01)
*G02F 1/13* (2006.01)
*G06F 1/16* (2006.01)
*H10K 77/10* (2023.01)
*G02F 1/1333* (2006.01)
*G02F 1/1335* (2006.01)
*H01L 27/146* (2006.01)
*H10K 50/80* (2023.01)
*H10K 102/00* (2023.01)

(52) U.S. Cl.
CPC ...... *H10K 77/111* (2023.02); *G02F 1/133331* (2021.01); *G02F 1/133528* (2013.01); *G06F 1/1641* (2013.01); *G06F 1/1652* (2013.01); *H01L 27/14678* (2013.01); *H10K 50/868* (2023.02); *H10K 2102/00* (2023.02); *H10K 2102/311* (2023.02)

(58) Field of Classification Search
CPC ........ H10K 50/84; H10K 59/12; H10K 59/40; H10K 59/87; H10K 77/111; H10K 2102/00; H10K 2102/311; G02F 1/133331; G02F 1/133528; G06F 1/1641; G06F 1/1652; G09F 9/301; H01L 27/14678; B32B 2457/206
See application file for complete search history.

(56) References Cited

U.S. PATENT DOCUMENTS

| | | | | |
|---|---|---|---|---|
| 6,686,063 B2 | 2/2004 | Kobayashi | ............ | H01L 51/524 |
| | | | | 428/917 |
| 7,463,734 B2 | 12/2008 | Tolbert | ................... | B32B 27/36 |
| | | | | 379/433.04 |
| 8,040,062 B2 | 10/2011 | Morimoto | ............ | H05K 9/0096 |
| | | | | 313/582 |
| 8,866,989 B2 | 10/2014 | Mathew | ................ | G06F 1/1637 |
| | | | | 349/58 |
| 8,982,547 B2 | 3/2015 | Sanford | ................ | G06F 1/1626 |
| | | | | 361/679.21 |
| 9,793,299 B2 | 10/2017 | Fukuda | .................. | G02F 1/1333 |
| 10,698,259 B2 | 6/2020 | Son | ................ | G02F 1/133606 |
| 10,795,195 B2 | 10/2020 | Kudo | ................ | G02F 1/133305 |
| 10,884,178 B2 | 1/2021 | Kim | ...................... | G02B 6/0055 |
| 2007/0011863 A1* | 1/2007 | Yoshikawa | ............. | H01J 9/205 |
| | | | | 29/592.1 |
| 2007/0065091 A1* | 3/2007 | Hinata | ............. | G02F 1/133308 |
| | | | | 385/147 |
| 2008/0297685 A1* | 12/2008 | Sugibayashi | ......... | G02F 1/1333 |
| | | | | 349/96 |
| 2010/0148179 A1 | 6/2010 | Maruyama | .......... | H01L 27/1214 |
| | | | | 257/E33.053 |
| 2010/0202077 A1 | 8/2010 | Kim | .................... | B29C 45/0053 |
| | | | | 29/592.1 |
| 2013/0300975 A1 | 11/2013 | Suzuki | ................... | H05B 33/02 |
| | | | | 362/19 |
| 2014/0111736 A1 | 4/2014 | An | .................... | G02F 1/133615 |
| | | | | 349/58 |
| 2014/0204310 A1 | 7/2014 | Lee | ................... | G02F 1/133528 |
| | | | | 349/62 |
| 2015/0234511 A1 | 8/2015 | Wang | .................... | G06F 3/0412 |
| | | | | 345/173 |
| 2015/0261043 A1 | 9/2015 | Lee | ................ | G02F 1/133385 |
| | | | | 349/67 |
| 2016/0161813 A1 | 6/2016 | Lee | ........................ | G02F 1/1309 |
| | | | | 349/12 |
| 2016/0307973 A1 | 10/2016 | Yang | ...................... | G06F 1/1643 |
| 2017/0192596 A1 | 7/2017 | Lee | ...................... | G02F 1/1339 |
| 2017/0262112 A1* | 9/2017 | Noguchi | ............. | G02F 1/13338 |
| 2017/0347474 A1 | 11/2017 | Alonso | ................. | H05K 5/0017 |
| 2018/0252981 A1 | 9/2018 | Gupta | .................. | G02B 6/0073 |
| 2019/0011605 A1 | 1/2019 | Park | ...................... | G03F 7/2002 |
| 2019/0018529 A1* | 1/2019 | Kudo | .................. | G06F 3/04166 |
| 2019/0181389 A1 | 6/2019 | Joo | ...................... | H01L 51/5256 |
| 2019/0271873 A1* | 9/2019 | Yabuki | ................ | G02F 1/13452 |
| 2020/0018872 A1 | 1/2020 | Fujii | ....................... | C23C 14/18 |

FOREIGN PATENT DOCUMENTS

| | | |
|---|---|---|
| KR | 1020170126067 A | 11/2017 |
| KR | 1020180053136 A | 5/2018 |

* cited by examiner

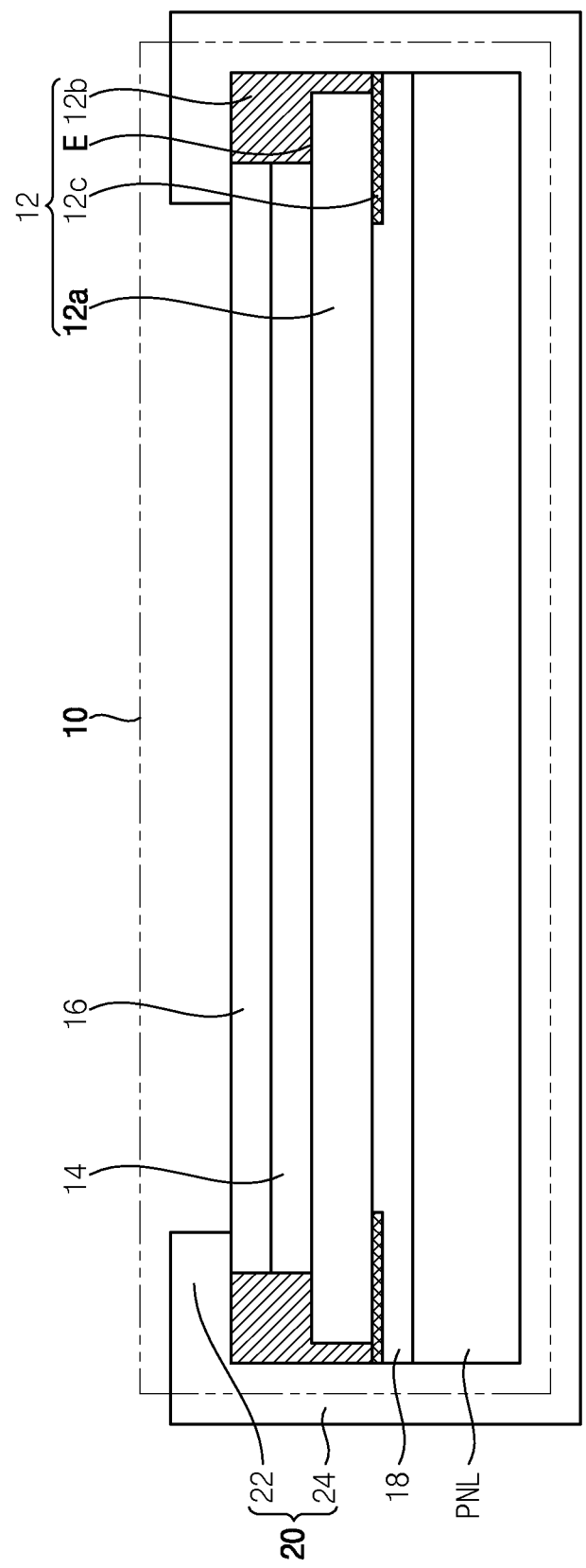

PROTECTIVE WINDOW INCLUDING PROTECTED EDGE GLASS SUBSTRATE

This application is a divisional application of U.S. application Ser. No. 16/987,474 filed Aug. 7, 2020, which claims priority to Korean Patent Application No. 10-2019-0105197 filed on Aug. 27, 2019, and all the benefits accruing therefrom under 35 U.S.C. § 119, the entire disclosure of which is incorporated by reference herein in its entirety.

BACKGROUND

1. Field

Exemplary embodiments relate to a display device. More particularly, exemplary embodiments relate to a protective window and a display device including the protective window.

2. Description of the Related Art

Requirements and applications for a foldable display device, which can be bent or folded by a user, are being increased.

A display device includes a protective window that covers a display surface to protect a display panel of the display device. In order to prepare a protective window that may be used for a foldable display device, a method using a flexible film formed of a polymeric material and a method using a thin glass substrate are being developed.

SUMMARY

Exemplary embodiments provide a protective window for a display device, which may prevent or reduce damage to a glass window or generation of dust.

Exemplary embodiments provide a display device including the protective window.

According to an exemplary embodiment, a protective window includes a glass substrate which faces a display surface of an image-generating panel and has a thickness of about 20 micrometers ($\mu$m) to about 80 $\mu$m; a protective film which faces the display surface of the image-generating panel with the glass substrate therebetween; an adhesive layer which is between the protective film and the glass substrate and combines the protective film with the glass substrate; and a protective layer which covers an edge portion of the glass substrate. A thickness of the protective layer which covers the edge portion of the glass substrate is equal to or less than about ⅓ of a thickness of the adhesive layer which combines the protective film with the glass substrate.

In an exemplary embodiment, the protective layer may include a polymeric curable resin.

In an exemplary embodiment, the protective layer may cover an upper surface of the glass substrate.

In an exemplary embodiment, the protective layer may extend to cover a side surface of the glass substrate.

In an exemplary embodiment, the protective window may further include a light-blocking layer disposed on a lower surface of the glass substrate.

In an exemplary embodiment, the light-blocking layer and the protective layer may include a same material.

In an exemplary embodiment, a length of the protective layer may be smaller than a length of the light-blocking layer.

In an exemplary embodiment, the length of the protective layer may be equal to or less than about 0.5 millimeter (mm).

In an exemplary embodiment, a thickness of the protective layer may be about 3 $\mu$m to about 12 $\mu$m.

In an exemplary embodiment, an adhesion force between the protective layer and the adhesive layer may be equal to or more than about 400 grams-force per inch (gf/inch).

According to an exemplary embodiment, a display device includes a display panel and a receiving member in which the display panel is received. The display panel includes an image-generating panel, and a protective window which is combined with the image-generating panel at a display surface of the image-generating panel. The protective window includes a glass substrate having a thickness of about 20 $\mu$m to about 80 $\mu$m, and a protective layer which covers an edge portion of the glass substrate having the thickness of about 20 $\mu$m to about 80 $\mu$m.

In an exemplary embodiment, the display panel may further include a protective film which faces the display surface of the image-generating panel with the glass substrate therebetween, and an adhesive layer which is between the protective film and the glass substrate and combines the protective film with the glass substrate.

In an exemplary embodiment, a portion of the protective layer may be between the protective film and the glass substrate.

In an exemplary embodiment, a thickness of the protective layer may be equal to or less than about ⅓ of a thickness of the adhesive layer.

In an exemplary embodiment, a side surface of the adhesive layer may face a side surface of the protective layer.

In an exemplary embodiment, the protruding portion of the receiving member may face an upper surface of the protective film.

In an exemplary embodiment, a side surface of the adhesive layer may face a side surface of the protective layer. A thickness of the protective layer may be greater than a thickness of the adhesive layer.

According to one or more exemplary embodiment, a protective layer covers an edge portion of a glass substrate of a protective window. Thus, damage or cracking of the glass substrate may be prevented or reduced. Thus, scattering of fine glass dust generated by the damage or cracking, may be reduced or effectively prevented.

Furthermore, a direct contact of the glass substrate with a receiving member may be reduced or effectively prevented. Thus, damage to the protective window due to repeated contacts or impacts may be reduced or effectively prevented.

Furthermore, the protective layer may overlap a protective film so that a surface of the glass substrate may not be exposed to outside the display device. Thus, a durability and reliability of the protective window may be improved.

BRIEF DESCRIPTION OF THE DRAWINGS

Features of one or more exemplary embodiments of the invention will be more clearly understood from the following detailed description taken in conjunction with the accompanying drawings.

FIGS. 5 to 9 are cross-sectional views illustrating exemplary embodiments of a display device.

DETAILED DESCRIPTION

Figure 1:
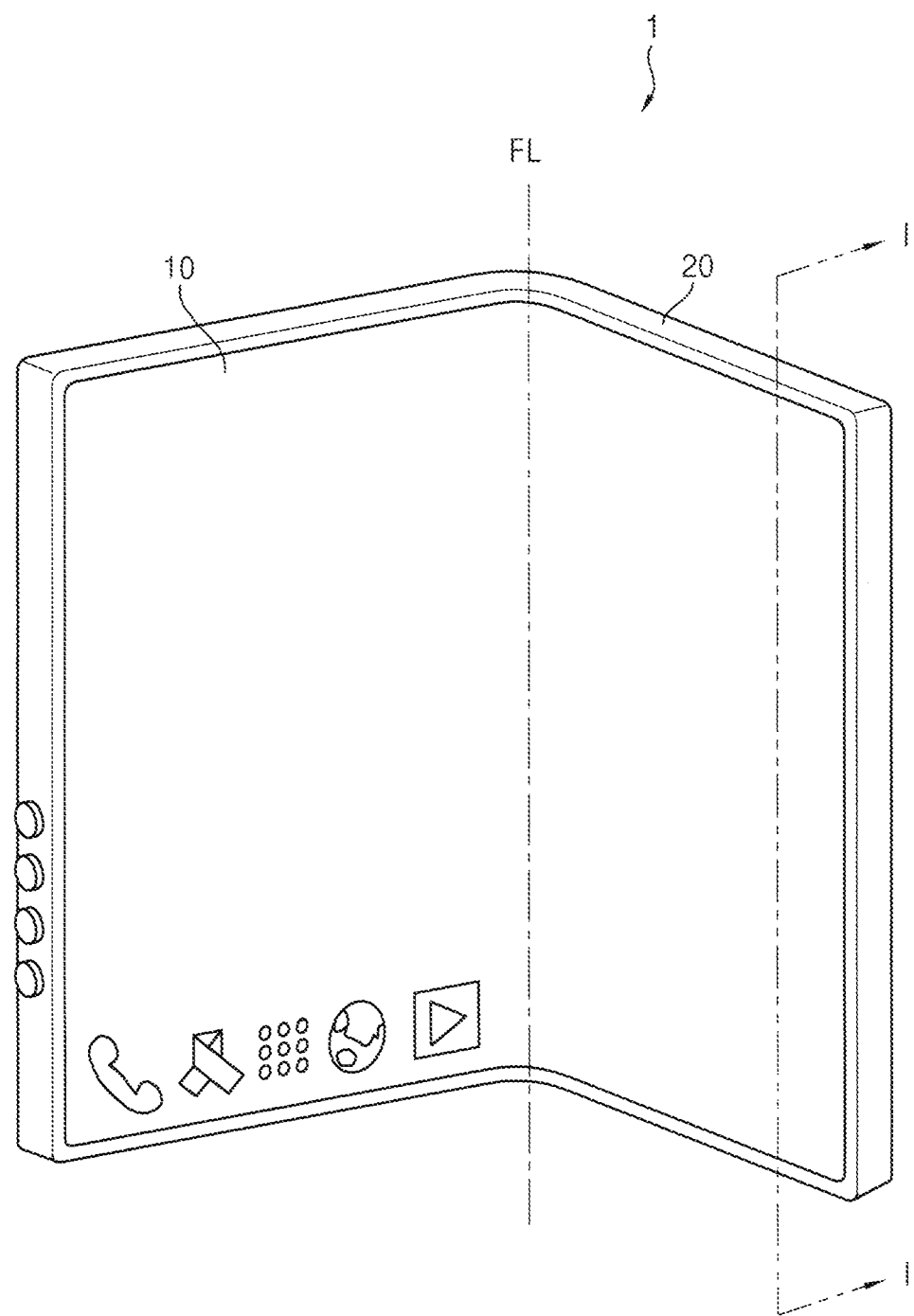
FIG. 1 is a perspective view illustrating an exemplary embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A glass window of a display device 1 has advantages such as a relatively high hardness, a high stability against a light or the like. However, when the glass window is repeatedly folded or when an impact is applied to the glass window, a crack may be generated therein. Thus, fine glass dust may be scattered from the cracked glass window.

A display device 1 according to exemplary embodiments will be described hereinafter with reference to the accompanying drawings, in which some exemplary embodiments are shown.

Figure 2:
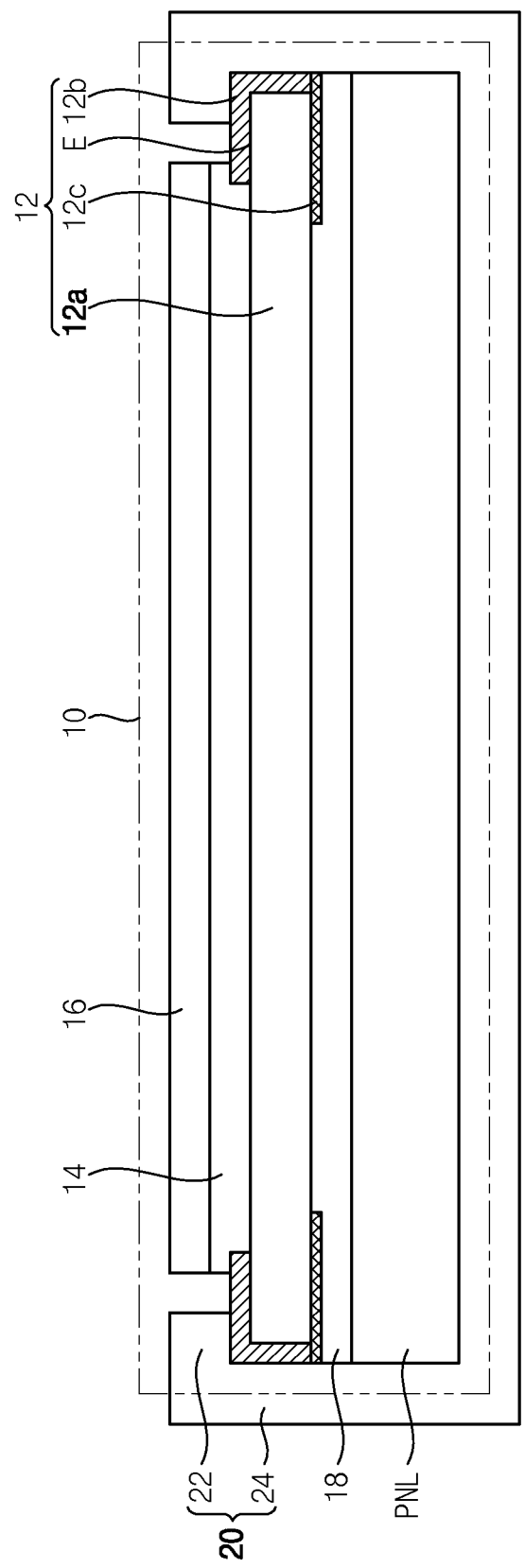
FIG. 2 is a cross-sectional view taken along line I-I' of FIG. 1.
Figure 3:
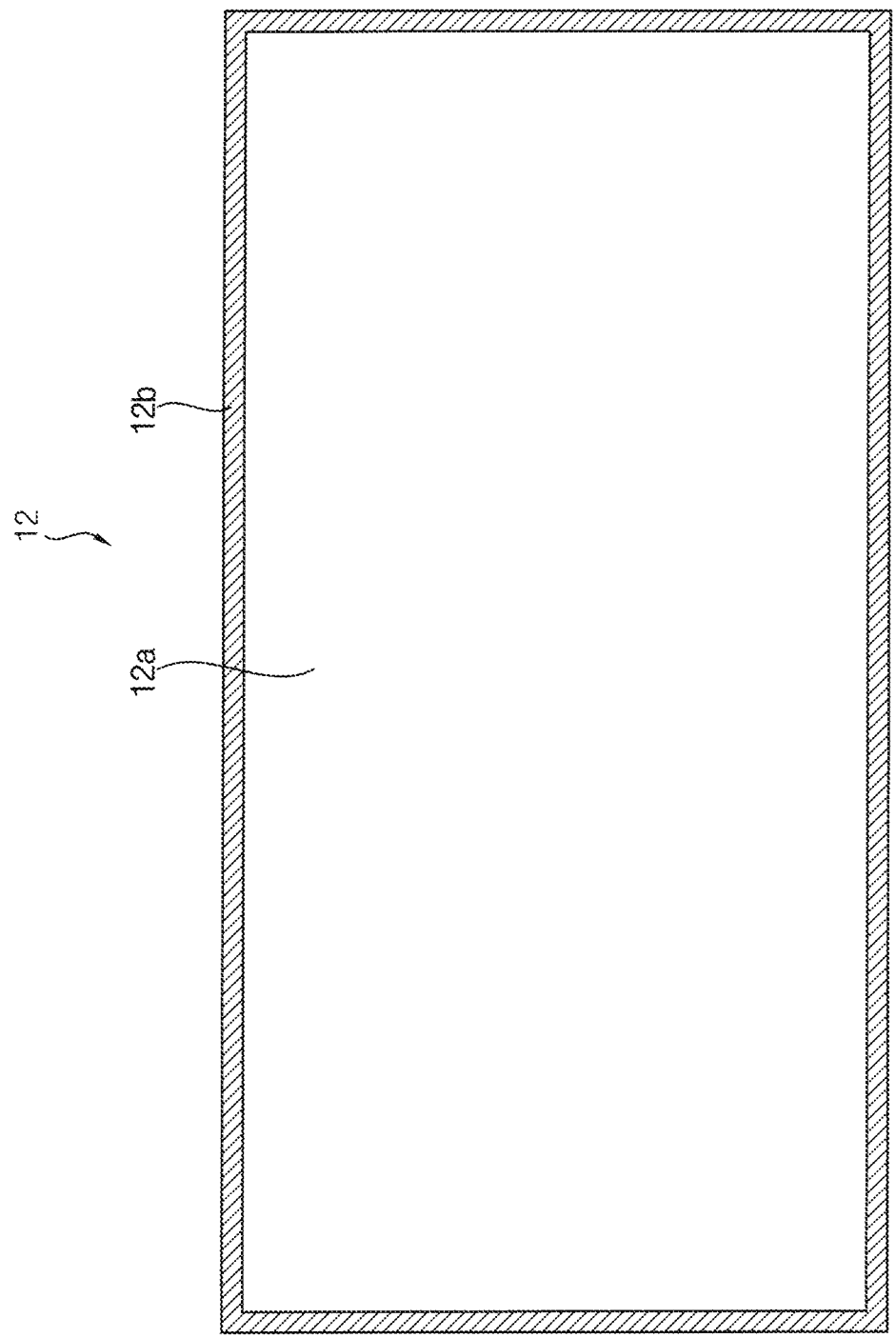
FIG. 3 is a plan view illustrating an exemplary embodiment of a protective window of a display device.

FIG. 1 is a perspective view illustrating an exemplary embodiment of a display device 1. FIG. 2 is a cross-sectional view taken along line I-I' of FIG. 1. FIG. 3 is a top plan view illustrating an exemplary embodiment of a protective window 12 of a display device 1.

Referring to FIGS. 1 and 2, a display device 1 includes a display panel 10 and a receiving member 20.

The display device 1 may be a foldable display device. In an exemplary embodiment, for example, the display device 1 may be bended or folded with respect to an axis extended along a folding line FL. The display device 1 may further include a hinge member for allowing bending or folding of the display device 1.

In an exemplary embodiment, the display device 1 may have an in-folding structure so that portions of a display surface may face each other and not be exposed to outside the display device 1 when the display device 1 is folded. However, exemplary embodiments are not limited thereto. In another exemplary embodiment, for example, the display device 1 may have an out-folding structure so that portions of the display surface may face away from each other and be exposed to outside the display device 1 when the display device 1 is folded.

Furthermore, exemplary embodiments are not limited to the structure illustrated in FIG. 1. For example, a display device 1 may have an asymmetric configuration with respect to a folding line FL, or a display device 1 may include a plurality of hinge structures so that the display device 1 may be folded at a plurality of axes to define a plurality of regions of the display device 1.

The display panel 10 may be combined with the receiving member 20. In an exemplary embodiment, for example, at least a portion of the display panel 10 may be disposed in the receiving member 20. The receiving member 20 may be opened at one side thereof to expose the display surface of the display panel 10 and components thereof to outside the receiving member 20.

The display panel 10 includes a panel part PNL (e.g., an image-generating panel or image-generating member) and a protective window 12. The protective window 12 covers an upper surface of the panel part PNL to protect the panel part PNL. The upper surface of the panel part PNL may be a display surface of the panel part PNL. The display panel 10 may further includes a protective film 16. The protective film 16 may be combined with the protective window 12 at an upper surface of the protective window 12, by a first adhesive layer 14. The protective window 12 may be combined with the panel part PNL by a second adhesive layer 18. An image which is generated by the panel part PNL, may be transmittable through the protective film 16, the first adhesive layer 14 and the protective window 12, to be visible from outside the display device 1.

In an exemplary embodiment, the protective window 12 includes a base substrate 12*a* and a protective layer 12*b* (e.g., a protective pattern which partially covers an upper surface of the base substrate 12*a*.

In an exemplary embodiment, the base substrate 12*a* includes glass (e.g., glass substrate). In an exemplary embodiment, for example, the base substrate 12*a* may include chemical-reinforced glass.

A chemical-reinforced portion may be formed by providing a surface of a glass substrate with a chemical-reinforcing treatment. In an exemplary embodiment, for example, a surface portion of the glass substrate may be exposed to potassium nitrate ($KNO_3$) or the like, and then heated, as a chemical-reinforcing treatment. As a result, sodium atoms may be substituted for potassium atoms, thereby increasing a strength of a portion of the glass substrate and provide a chemical-reinforced portion thereof (e.g., the surface portion).

A compressive stress is applied to the chemical-reinforced portion of the glass substrate, and a tensile stress is applied to a portion of the glass substrate which is not chemical-reinforced. Thus, a glass substrate with increased strength and hardness may be obtained. The chemical-reinforced portion of the glass substrate may correspond to an upper portion of the base substrate 12*a*. An upper portion of the base substrate 12*a* may include an uppermost surface or the uppermost surface together with a thickness portion extended along a thickness direction from the uppermost surface.

A protective window 12 for a display device 1 which is foldable, should be foldable or bendable in response to deformation of the display device 1. Thus, the base substrate 12*a* may have a relatively small bending stiffness. In an exemplary embodiment, for example, a thickness of the base substrate 12*a* may be about 20 micrometers (μm) to about 80 μm. When the thickness of the base substrate 12*a* is less than 20 μm, the strength and the hardness of the base substrate 12*a* are excessively reduced. Thus, it may be difficult to achieve necessary durability. When the thickness of the base substrate 12*a* is greater than 80 μm, bending stiffness may be excessively increased. Thus, a radius of curvature may be increased, or the base substrate 12*a* may be easily damaged by folding or bending thereof.

In an exemplary embodiment, the protective layer 12*b* may be provided at an edge portion E of the base substrate 12*a*, such as to cover an edge portion E of the base substrate 12*a*. In an exemplary embodiment, for example, as illustrated in FIG. 3, the protective layer 12*b* may have a frame shape extending along the edge portion E of the base substrate 12*a*, in a top plan view.

In an exemplary embodiment, the protective layer 12*b* may extend from an uppermost surface of the base substrate 12*a* which is at the edge portion E thereof, to cover a side surface of the base substrate 12*a* which is at the edge portion E thereof. Thus, the protective layer 12*b* may have a bent shape to cover both the upper surface and the side surface of the base substrate 12*a*. The edge portion E of the base substrate 12*a* may be exposed outside the first adhesive layer 14 and/or the protective film 16. In an exemplary embodiment, the base substrate 12*a* may extend further than an end of the first adhesive layer 14 and/or the protective film 16, to define the edge portion E of the base substrate 12*a*.

The protective layer 12*b* may include a polymeric material. In an exemplary embodiment, for example, the protective layer 12*b* may include or be formed from a polymeric curable resin. In an exemplary embodiment, for example, the polymeric curable resin may include an acrylic resin, a phenol resin, a urethane resin, an epoxy resin or the like.

The protective layer 12*b* may include or be formed by a photo-curable resin. In an exemplary embodiment, for example, the photo-curable resin may include a binder component including a polymer or an oligomer, a multi-functional monomer, a photo-initiator, an inorganic filler or the like. The binder component may include an acrylic resin, a urethane-acryl oligomer, an epoxy-acryl oligomer or the like. The multi-functional monomer may include a multi-functional acrylate.

The protective layer 12*b* may be transparent or opaque. In an exemplary embodiment, for example, the protective layer 12*b* may include a dye, a pigment, a light-blocking carbon particle or the like to block a light. In an exemplary embodiment, for example, the protective layer 12*b* may include or be formed from a curable ink or a black matrix material.

The protective window 12 may further include a light-blocking layer 12*c* (e.g., light-blocking pattern) combined with the base substrate 12*a* at a lower surface of the base substrate 12*a*. The light-blocking layer 12*c* may reduce or effectively prevent a peripheral area of the panel part PNL from being viewable from outside the display device 1, and/or may reduce or effectively prevent light leakage in a peripheral area or edge portion of the display device 1. In an exemplary embodiment, for example, the light-blocking layer 12*c* may include or be formed from a black matrix material.

In an exemplary embodiment of providing a display device 1, the protective layer 12*b* and the light-blocking layer 12*c* may be provided or formed in a same process, such as by using a black matrix material. In an exemplary embodiment, for example, a portion of the base substrate 12*a* is covered by a mask or the like. A black matrix material is provided such as by spraying, onto a remaining portion of the base substrate 12a except for the masked portion, and then cured to form the protective layer 12b and the light-blocking layer 12c in the same process. That is, the protective layer 12b and the light-blocking layer 12c may be respective portions of a same material layer on the base substrate 12a.

The display device 1 and components thereof, may be disposed in a plane defined by a first direction and a second direction which cross each other. In FIG. 2, a horizontal direction may variously represent the first direction and/or the second direction. A thickness of the display device 1 and components thereof may extend along a third direction crossing each of the first direction and the second direction. In FIG. 2, a vertical direction represents the third direction (e.g., a thickness direction). A dimension (e.g., length, width, etc.) of a bezel of the display device 1 may be defined along the first direction and/or the second direction.

Referring to FIG. 3, the protective layer 12b may have a length extended along the horizontal direction. In an exemplary embodiment, a length of the protective layer 12b may be equal to or less than about 0.5 millimeter (mm). When the length of the protective layer 12b is excessively large, a bezel size of the display device 1 may be increased, or the protective layer 12b may be perceived from outside the display device 1.

Referring to FIG. 3, the light-blocking layer 12c may have a length extended along the horizontal direction. In an exemplary embodiment, a length of the light-blocking layer 12c may be about 0.3 mm to about 1.0 mm. In an exemplary embodiment, the length of the light-blocking layer 12c may be larger than the length of the protective layer 12b. That is, the light-blocking layer 12c may extend further from (e.g., terminate at a position further from) an outer edge of the base substrate 12a than the protective layer 12b. However, exemplary embodiments are not limited thereto. In an exemplary embodiment, for example, the length of the light-blocking layer 12c may be smaller than the length of the protective layer 12b, depending on a transparency of the protective layer 12b and a design of the display device 1.

In an exemplary embodiment, the receiving member 20 may cover at least a portion of an upper surface of the protective layer 12b. Referring to FIG. 2, for example, the receiving member 20 may include a sidewall portion 24 and a protruding portion 22 (e.g., a cover portion). The sidewall portion 24 extends along and faces a side surface of the protective window 12. The protruding portion 22 extends along and faces an upper surface of the protective window 12.

The protective film 16 covers an upper surface of the protective window 12. In an exemplary embodiment, for example, the protective film 16 may include a polymeric material such as polyethylene terephthalate ("PET"), polycarbonate ("PC"), polymethylmethacrylate ("PMMA"), thermoplastic polyurethane ("TPU") or the like.

In another exemplary embodiment, the display device 1 may not include the protective film 16 and the first adhesive layer 14. Furthermore, the protective film 16 and the first adhesive layer 14 may be defined as components of the protective window 12. The protective film 16 may be exposed outside the display device 1. The protective film 16 may define a display surface of the display device 1, without being limited thereto.

In an exemplary embodiment, for example, the first adhesive layer 14 and the second adhesive layer 18 may include an optical clear adhesive ("OCA") film, a pressure sensitive adhesive or the like.

In an exemplary embodiment, the protective film 16 may partially cover the protective layer 12b. In an exemplary embodiment, for example, the protective film 16 and the first adhesive layer 14 may partially overlap the protective layer 12b at inner ends thereof. A portion of the protective layer 12b may be exposed outside the display device 1, such as at an area between an inner end of the receiving member 20 and an outer end of the protective window 12.

In an exemplary embodiment, a thickness of the protective film 16 may be about 20 µm to about 70 µm, and a thickness of the first adhesive layer 14 may be about 20 µm to about 50 µm.

In an exemplary embodiment, a thickness of the protective layer 12b may be about 3 µm to about 100 µm. In an exemplary embodiment, the thickness of the protective layer 12b may be about 3 µm to about 30 µm. When the thickness of the protective layer 12b is less than 3 µm, coating a material for forming the protective layer 12b and obtaining desired protecting effects of the protective window 12 may be difficult.

When the first adhesive layer 14 and the protective layer 12b overlap each other, the thickness of the protective layer 12b may be equal to or less than about ⅓ of the thickness of the first adhesive layer 14. When the thickness of the protective layer 12b is greater than ⅓ of the thickness of the first adhesive layer 14, bubbles may be formed by a thickness difference between the two layers, thereby deteriorating adhesion reliability between the layers. In an exemplary embodiment, for example, the thickness of the protective layer 12b may be about 3 µm to about 12 µm.

The protective film 16 may be separable from the protective window 12, for replacement or the like. When the protective film 16 is separable from the protective window 12, an adhesion force between the protective layer 12b and the base substrate 12a may be greater than an adhesion force between the protective layer 12b and the protective film 16 in order to maintain adhesion between the protective layer 12b and the base substrate 12a. In an exemplary embodiment, for example, the adhesion force between the protective layer 12b and the base substrate 12a may be equal to or more than about 400 grams-force per inch (gf/inch).

An edge (e.g., an outer edge or an outer surface) of the base substrate 12a including glass may be relatively easily damaged or cracked by stress concentration or an external force. In a display device 1 which is foldable, the receiving member 20 may not include the protruding portion 22 where a hinge structure is disposed. Thus, a base substrate 12a including glass may be exposed to outside the receiving member 20 and/or the display device 1.

In an exemplary embodiment, the protective layer 12b covers a relatively weak portion of the base substrate 12a, e.g., an outer edge and an upper surface adjacent thereto. Thus, damage or crack of the base substrate 12a including glass may be prevented or reduced. Thus, scattering of fine glass dust caused by damage or cracking of the base substrate 12a including glass, may be reduced or effectively prevented.

Furthermore, a direct contact of the base substrate 12a including glass, with the receiving member 20, may be reduced or effectively prevented. Thus, damage to the protective window 12 due to repeated contacts or impacts may be reduced or effectively prevented.

Furthermore, since the protective layer 12b overlaps the protective film 16, an upper surface of the base substrate 12a including glass may not be exposed to outside the protective window 12. Thus, a durability and reliability of the protective window 12 may be improved.

Figure 4:
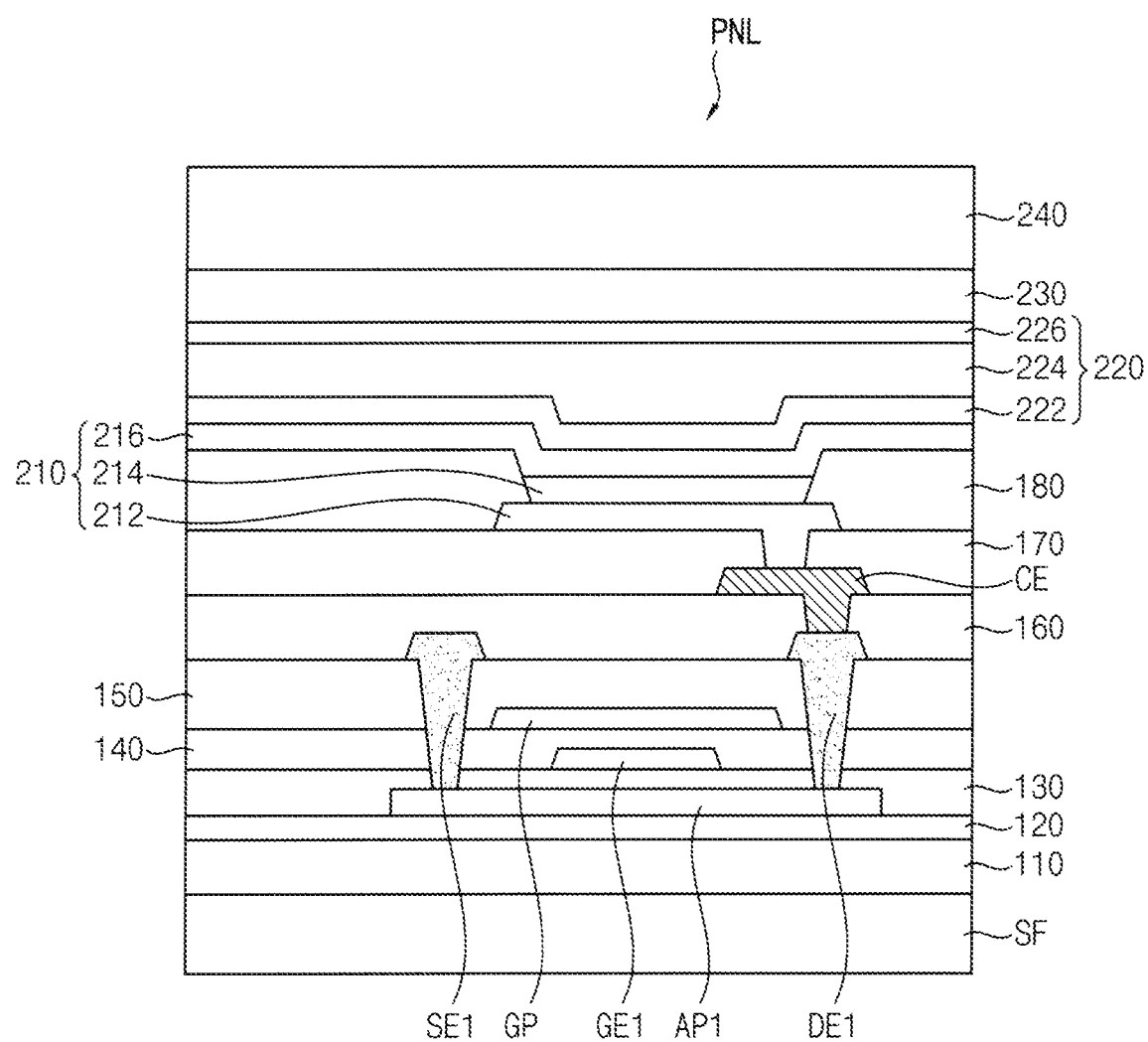
FIG. 4 is a cross-sectional view illustrating an exemplary embodiment of a panel part of a display device.

FIG. 4 is a cross-sectional view illustrating an exemplary embodiment of a panel part PNL of a display device 1. In an exemplary embodiment, the display device 1 may include an organic light-emitting display panel as the panel part PNL. However, exemplary embodiments are not limited thereto. In an exemplary embodiment, for example, a display device 1 may include various display panels as the panel part PNL, such as a liquid crystal display panel, an electro-luminescence display panel, a micro light-emitting diode ("LED") panel or the like.

FIG. 4 may illustrate a pixel unit (e.g., pixel) of the panel part PNL, including a light-emitting element. The pixel unit may include a driving transistor and a light-emitting element which is electrically connected to the driving transistor. In an exemplary embodiment, the light-emitting element may be an organic light-emitting diode.

Referring to FIG. 4, a supporting film SF may be disposed on a lower surface of a base substrate 110 to support the base substrate 110. In an exemplary embodiment, the supporting film SF may be patterned to reduce stress in a bending area thereof, which is caused by folding of the display device 1 and/or the display panel 10 therein.

A buffer layer 120 may be disposed on the base substrate 110. A first active pattern AP1 may be disposed on the buffer layer 120.

In an exemplary embodiment, for example, the base substrate 110 may include or be formed of a polymeric material to have a relatively high flexibility. In an exemplary embodiment, for example, the base substrate 110 may include polyethylene terephthalate, polyethylene naphthalate, polyether ketone, polycarbonate, polyarylate, polyether sulfone, polyimide or a combination thereof.

The buffer layer 120 may prevent or reduce permeation of impurities, humidity or external gas to layers above the buffer layer 120, from underneath the base substrate 110, and may planarize an upper surface of the base substrate 110. In an exemplary embodiment, for example, the buffer layer 120 may include an inorganic material such as silicon oxide, silicon nitride or the like.

A first gate electrode GE1 may be disposed on the first active pattern AP1. A first insulation layer 130 may be disposed between the first active pattern AP1 and the first gate electrode GE1.

A gate wiring pattern GP may be disposed on the first gate electrode GE1. The gate wiring pattern GP may include a capacitor electrode for forming a capacitor, a wiring for transferring various signals or the like.

A second insulation layer 140 may be disposed between the first gate electrode GE1 and the gate wiring pattern GP. A third insulation layer 150 may be disposed on the gate wiring pattern GP.

In an exemplary embodiment, for example, the first active pattern AP1 may include silicon or a metal oxide semiconductor. In an exemplary embodiment, the first active pattern AP1 may include polycrystalline silicon (polysilicon), which may be doped with n-type impurities or p-type impurities.

In another exemplary embodiment or in another transistor that is not illustrated, an active pattern may include a metal oxide semiconductor. In an exemplary embodiment, for example, the active pattern may include a two-component compound (ABx), ternary compound (ABxCy) or four-component compound (ABxCyDz), which contains indium (In), zinc (Zn), gallium (Ga), tin (Sn), titanium (Ti), aluminum (Al), hafnium (Hf), zirconium (Zr), magnesium (Mg) or the like. In an exemplary embodiment, for example, the active pattern may include zinc oxide ("ZnOx"), gallium oxide ("GaOx"), titanium oxide ("TiOx"), tin oxide ("SnOx"), indium oxide ("InOx"), indium-gallium oxide ("IGO"), indium-zinc oxide ("IZO"), indium tin oxide ("ITO"), gallium zinc oxide ("GZO"), zinc magnesium oxide ("ZMO"), zinc tin oxide ("ZTO"), zinc zirconium oxide ("ZnZrxOy"), indium-gallium-zinc oxide ("IGZO"), indium-zinc-tin oxide ("IZTO"), indium-gallium-hafnium oxide ("IGHO"), tin-aluminum-zinc oxide ("TAZO"), indium-gallium-tin oxide ("IGTO") or the like.

The first insulation layer 130, the second insulation layer 140 and the third insulation layer 150 may include silicon oxide, silicon nitride, silicon carbide or a combination thereof. Furthermore, the first insulation layer 130, the second insulation layer 140 and the third insulation layer 150 may include an insulating metal oxide such as aluminum oxide, tantalum oxide, hafnium oxide, zirconium oxide, titanium oxide or the like. In an exemplary embodiment, for example, the first insulation layer 130, the second insulation layer 140 and the third insulation layer 150 may have a single-layered structure or a multi-layered structure including silicon nitride and/or silicon oxide, respectively, or may have different structures from each other.

The first gate electrode GE1 and the gate wiring pattern GP may include a metal, a metal alloy, a metal nitride, a conductive metal oxide or the like. In an exemplary embodiment, for example, the first gate electrode GE1 and the gate wiring pattern GP may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers. In an exemplary embodiment, the first gate electrode GE1 and the gate wiring pattern GP may have a multi-layered structure including at least molybdenum.

A first source metal pattern may be disposed on the third insulation layer 150. The first source metal pattern may include a first source electrode SE1 and a first drain electrode DE1, which contact the first active pattern AP1. The first source electrode SE1 and the first drain electrode DE1 may extend through the insulation layers disposed thereunder to contact the first active pattern AP1, respectively.

A fourth insulation layer 160 may be disposed on the first source metal pattern. A second source metal pattern may be disposed on the fourth insulation layer 160. The second source metal pattern may include a connection electrode CE to electrically connect the first drain electrode DE1 to an organic light-emitting diode 210 disposed thereon. In an exemplary embodiment, the second source metal pattern may further include a mesh power line to reduce or effectively prevent voltage drop of a power applied to the organic light-emitting diode 210. A fifth insulation layer 170 may be disposed on the second source metal pattern.

The first and second source metal patterns may include a metal, a metal alloy, a metal nitride, a conductive metal oxide or the like. In an exemplary embodiment, for example, the first and second source metal patterns may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers. In an exemplary embodiment, the first and second source metal patterns may have a multi-layered structure including at least an aluminum layer. In an exemplary embodiment, for example, the first and second source metal patterns may have a stacked structure of an aluminum layer and a titanium layer.

The fourth insulation layer 160 and the fifth insulation layer 170 may include an organic material. In an exemplary embodiment, for example, the fourth insulation layer 160 and the fifth insulation layer 170 may include an organic insulation material such as a phenol resin, an acryl resin, a polyimide resin, a polyamide resin, a silioxane resin, an epoxy resin or the like.

The organic light-emitting diode 210 may be disposed on the fifth insulation layer 170. The organic light-emitting diode 210 may include a first electrode 212 contacting the connection electrode CE, a light-emitting layer 214 disposed on the first electrode 212, and a second electrode 216 disposed on the light-emitting layer 214. The light-emitting layer 214 of the organic light-emitting diode 210 may be disposed in an opening of a pixel-defining layer 180 disposed on the fifth insulation layer 170. The first electrode 212 may be a lower electrode of the organic light-emitting diode 210, and the second electrode 216 may be an upper electrode of the organic light-emitting diode 210.

The first electrode 212 may function as an anode. In an exemplary embodiment, for example, the first electrode 212 may be provided or formed as a transmitting electrode or a reflecting electrode according to an emission type of the display device 1. When the first electrode 212 is a transmitting electrode, the first electrode 212 may include indium tin oxide, indium zinc oxide, zinc tin oxide, indium oxide, zinc oxide, tin oxide or the like. When the first electrode 212 is a reflecting electrode, the first electrode 212 may include gold (Au), silver (Ag), aluminum (Al), copper (Cu), nickel (Ni), platinum (Pt), magnesium (Mg), chromium (Cr), tungsten (W), molybdenum (Mo), titanium (Ti) or a combination thereof, and may have a stacked structure further including the material that may be used for the transmitting electrode.

Portions of the pixel-defining layer 180 define the opening exposing at least a portion of the first electrode 212 and in which the light-emitting layer 214 is disposed. In an exemplary embodiment, for example, the pixel-defining layer 180 may include an organic insulating material.

The light-emitting layer 214 may include at least an organic light-emitting material layer, and may further include at least one of a hole injection layer ("HIL"), a hole transporting layer ("HTL"), an electron transporting layer ("ETL") and an electron injection layer ("EIL"). In an exemplary embodiment, for example, the light-emitting layer 214 may include a relatively low molecular weight organic material or a relatively high molecular weight organic material.

In an exemplary embodiment, the light-emitting layer 214 may emit a red light, a green light or a blue light. In another exemplary embodiment, the light-emitting layer 214 may emit a white light. The light-emitting layer 214 emitting a white light may have a multi-layered structure including a red-emitting layer, a green-emitting layer and a blue-emitting layer, or a single-layered structure including a combination of a red-emitting material, a green-emitting material and a blue-emitting material.

The second electrode 216 may be provided or formed as a transmitting electrode or a reflecting electrode according to an emission type of the display device 1. In an exemplary embodiment, for example, when the second electrode 216 is a transmitting electrode, the second electrode 216 may include a metal, a metal alloy, a metal nitride, a metal fluoride, a conductive metal oxide or a combination thereof.

In an exemplary embodiment, for example, the second electrode 216 may extend continuously across a plurality of pixel units (e.g., pixels) in a display area of the panel part PNL and/or the display device 1, to be commonly disposed with respect to such pixels. In an exemplary embodiment, a capping layer and a blocking layer may be provided or formed on the second electrode 216.

The display device 1 further includes an encapsulation layer 220 covering the organic light-emitting diode 210. The encapsulation layer 220 may extend to cover an entirety of the display area, such as to be commonly disposed with respect to the pixels.

The encapsulation layer 220 may have a stacked structure including an inorganic thin film and an organic thin film. In an exemplary embodiment, for example, as illustrated in FIG. 4, the encapsulation layer 220 may include a first inorganic thin film 222 (e.g., first inorganic layer), an organic thin film 224 (e.g., organic layer) disposed on the first inorganic thin film 222, and a second inorganic thin film 226 (e.g., second inorganic layer) disposed on the organic thin film 224. However, exemplary embodiments are not limited thereto. In an exemplary embodiment, for example, the encapsulation layer 220 may have a structure including at least two organic thin films and at least three inorganic thin films.

In an exemplary embodiment, for example, the organic thin film 224 includes a cured resin such as polyacrylate or the like. In an exemplary embodiment, for example, the cured resin may be provided or formed from a cross-linking reaction of monomers to include cross-linked monomers. In an exemplary embodiment, for example, the inorganic thin films 222 and 226 may include an inorganic material such as silicon oxide, silicon nitride, silicon carbide, aluminum oxide, tantalum oxide, hafnium oxide, zirconium oxide, titanium oxide or the like.

In an exemplary embodiment, a touch-sensing part 230 (e.g., touch-sensing layer) may be disposed on the encapsulation layer 220. The touch-sensing part 230 may sense input position by contact applied to the touch-sensing part 230 and/or the display device 1. The touch-sensing part 230 may be provided or formed directly on the encapsulation layer 220 or may be provided or formed separate from the encapsulation layer 220 and subsequently combined with the encapsulation layer 220 as a screen panel after being individually manufactured. In an exemplary embodiment, for example, the touch-sensing part 230 may include a conductive layer including an array of electrodes (e.g., touch electrodes) and a bridge pattern electrically connecting the electrodes to each other.

A polarization layer 240 may be disposed on the touch-sensing part 230. An adhesive agent or a transparent adhesive film may be provided between the polarization layer 240 and the touch-sensing part 230.

FIGS. 5 to 9 are cross-sectional views illustrating exemplary embodiments of a display device 1.

Figure 5:
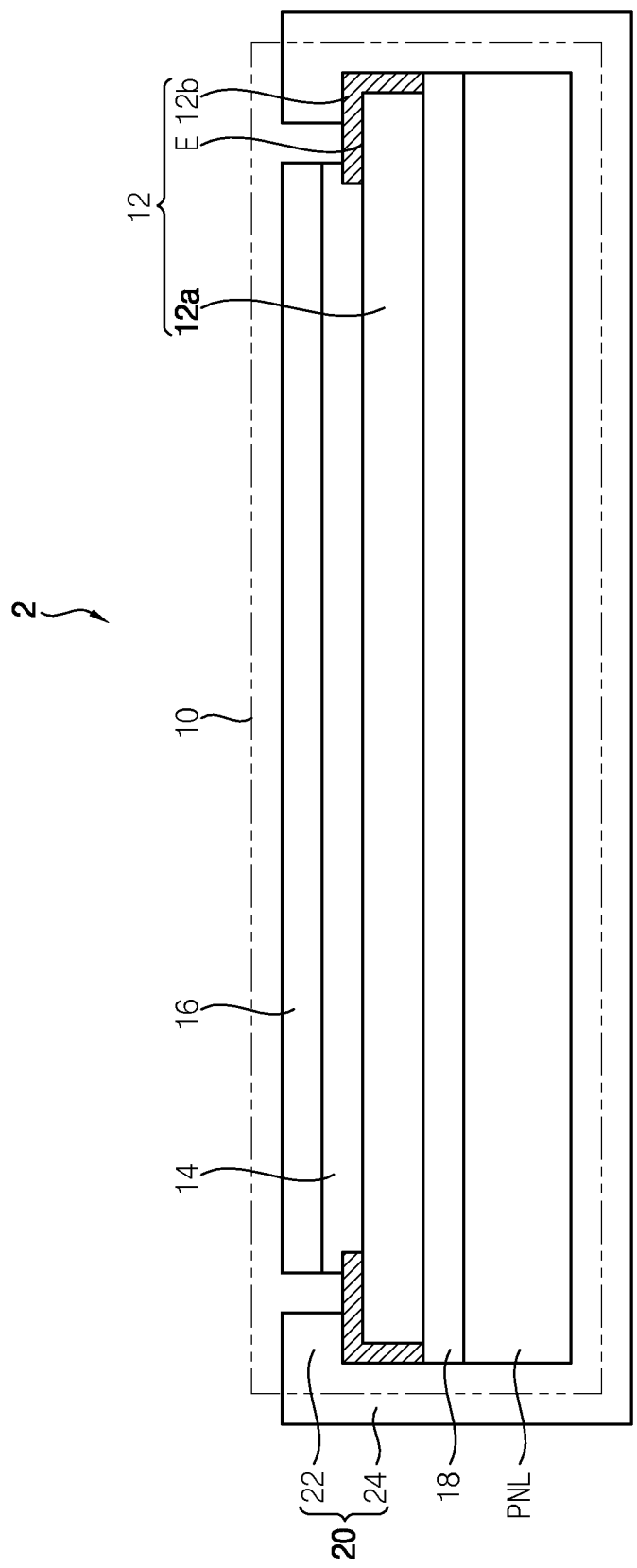

Referring to FIG. 5, a display device 2 includes a display panel 10 and a receiving member 20.

The display panel 10 includes a panel part PNL and a protective window 12. The protective window 12 covers an upper surface of the panel part PNL to protect the panel part PNL. A protective film 16 may be combined with an upper surface of the protective window 12 by a second adhesive layer 18.

In an exemplary embodiment, the protective window 12 includes a base substrate 12a and a protective layer 12b which partially covers an upper surface of the base substrate 12a.

As illustrated in FIG. 5, the protective window 12 may not include a light-blocking layer 12c disposed under the base substrate 12a.

Figure 6:
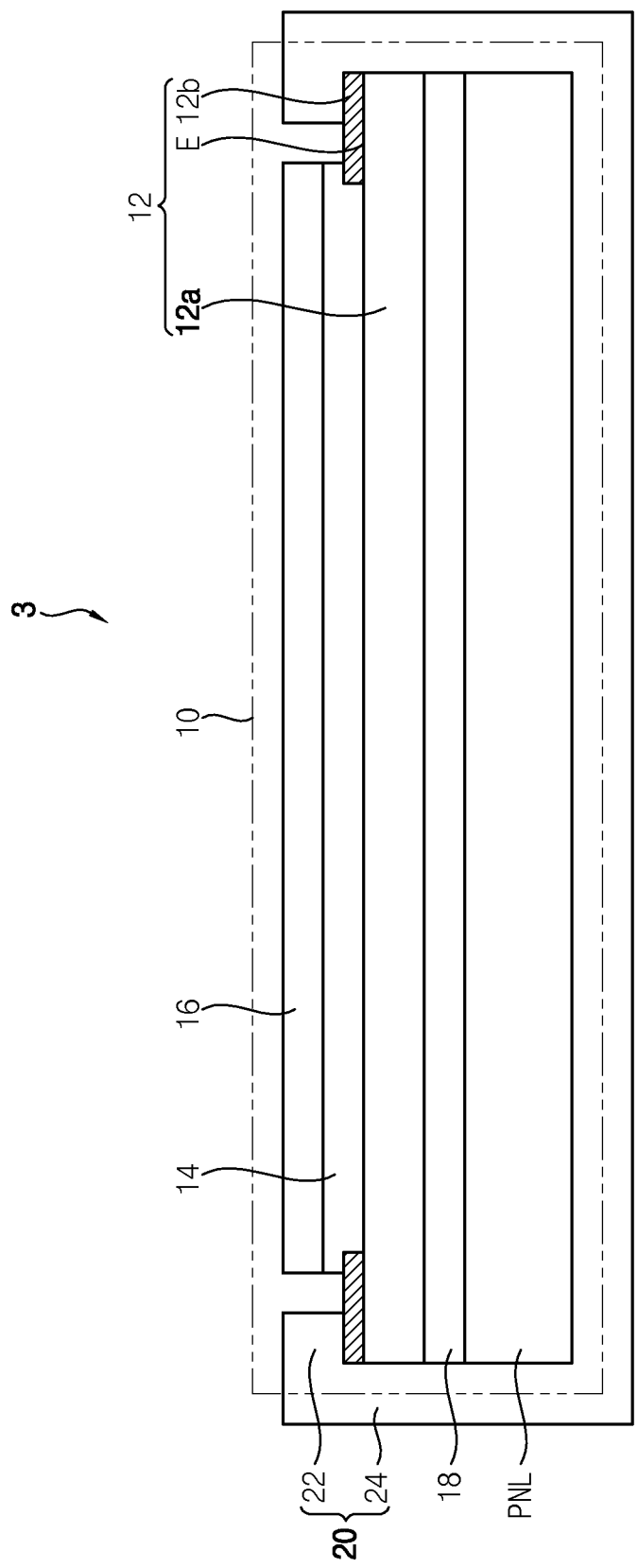

Referring to FIG. 6, in a display device 3, a protective layer 12b may be disposed only on an upper surface of a base substrate 12a without covering or facing a side surface of the base substrate 12a.

Figure 7:
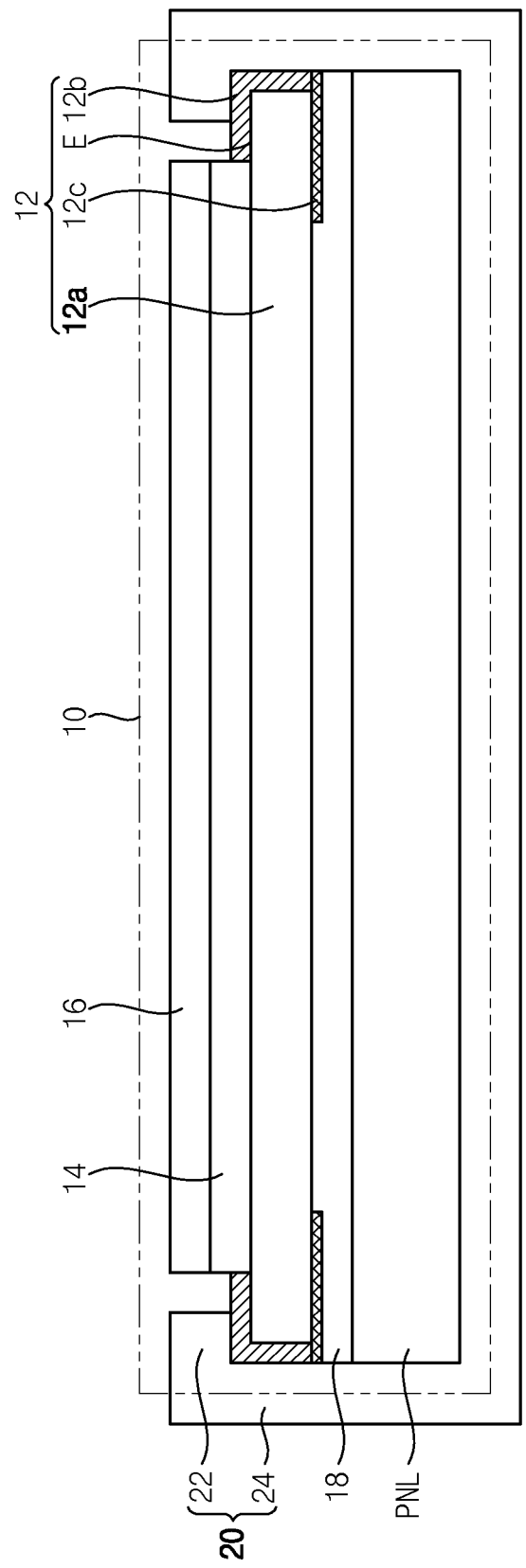

Referring to FIG. 7, in a display device 4, a protective film 16 and a first adhesive layer 14 may not overlap a protective layer 12b. Thus, a side surface of the protective layer 12b may face a side surface of the first adhesive layer 14. In an exemplary embodiment, the protective layer 12b may be adjacent to or substantially contact the first adhesive layer 14 at a side surface thereof, instead of overlapping the first adhesive layer 14, in order to minimize an exposed area of an upper surface of the base substrate 12a.

Figure 8:
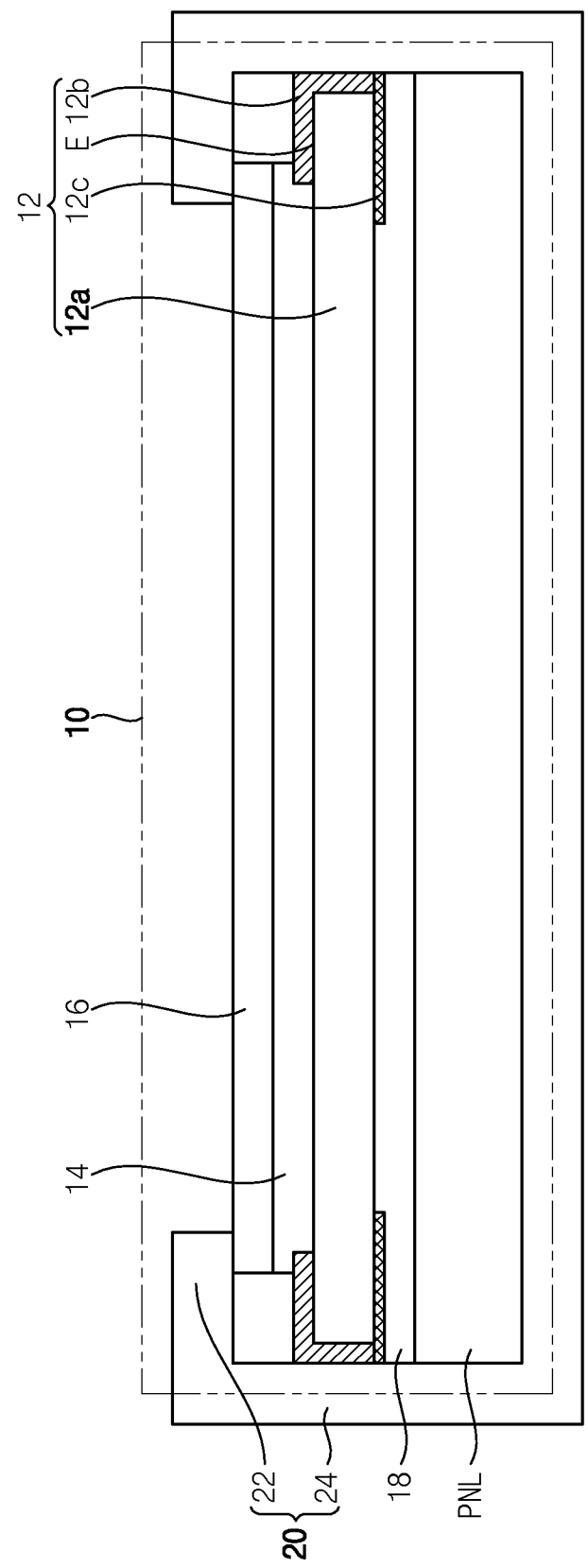

Referring to FIG. 8, in a display device 5, a protruding portion 22 of a receiving member 20 may extend to the protective film 16 to face an upper surface of a protective film 16. In an exemplary embodiment, the protective film 16 includes an upper surface which is furthest from the base substrate 12a, and at the edge portion E of the base substrate 12a, the protruding portion 22 of the receiving member 20 faces the upper surface of the protective film 16. Thus, the protective film 16 and a first adhesive layer 14 may be disposed under the protruding portion 22 of the receiving member 20. Furthermore, the protruding portion 22 of the receiving member 20 may overlap an entirety of a protective layer 12b (e.g., an entire length). According to an exemplary embodiment, undesired separation of the protective film 16 may be reduced or effectively prevented.

Referring to FIG. 9, in a display device 6, a protruding portion 22 of a receiving member 20 may extend to face an upper surface of a protective film 16. A protective film 16 and a first adhesive layer 14 may not overlap a protective layer 12b. Thus, the protruding portion 22 of the receiving member 20 may overlap an entirety of a protective layer 12b.

In an exemplary embodiment, a thickness of the protective layer 12b may be greater than a thickness of the first adhesive layer 14. In an exemplary embodiment, for example, an upper surface of the protective layer 12b may contact a lower surface of the protruding portion 22 of the receiving member 20. A space above the base substrate 12a may be defined by inner surfaces of the receiving member 20, end side surfaces of the first adhesive layer 14 and the protective film 16, along with the base substrate 12a. Referring to FIG. 9, the protective layer 12b may fill such space, without being limited thereto.

In an exemplary embodiment, the first adhesive layer 14 does not overlap the protective layer 12b. Thus, bubbles caused in an overlapping area by a step may be reduced or effectively prevented. Thus, the protective layer 12b may be allowed to have an increased thickness.

According to one or more exemplary embodiment, undesired separation of the protective film 16 from other layers within the display device 1, may be reduced or effectively prevented. With reduced separation of the protective film 16 from other layers, an impact resistance of the protective window 12 may be improved.

Exemplary embodiments of the display device 1 may be applied to various electronic display devices. One or more exemplary embodiment may be applied to a vehicle-display device, a ship-display device, an aircraft-display device, a portable communication device, an information transfer device, a medical display device, etc.

The foregoing is illustrative of exemplary embodiments and is not to be construed as limiting thereof. Although exemplary embodiments have been described, those skilled in the art will readily appreciate that many modifications are possible in the exemplary embodiments without materially departing from the novel teachings of the invention. Accordingly, all such modifications are intended to be included within the scope of the invention. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the invention, as set forth in the following claims and equivalents thereof.

What is claimed is:

1. A protective window comprising:
   a glass substrate which faces a display surface of an image-generating panel and has a thickness of about 20 micrometers to about 80 micrometers;
   a protective film which faces the display surface of the image-generating panel with the glass substrate therebetween;
   an adhesive layer which is between the protective film and the glass substrate and combines the protective film with the glass substrate; and
   a protective layer which covers an edge portion of the glass substrate,
   wherein a thickness of the protective layer which covers the edge portion of the glass substrate is equal to or less than about ⅓ of a thickness of the adhesive layer which combines the protective film with the glass substrate.

2. The protective window of claim 1, wherein the protective layer includes a polymeric curable resin.

3. The protective window of claim 1, wherein at the edge portion of the glass substrate, the protective layer covers an upper surface of the glass substrate.

4. The protective window of claim 3, wherein at the edge portion of the glass substrate, the protective layer extends from the upper surface of the glass substrate to cover a side surface of the glass substrate.

5. The protective window of claim 3, further comprising at the edge portion of the glass substrate, a light-blocking layer facing the protective layer with the glass substrate therebetween.

6. The protective window of claim 5, wherein the light-blocking layer and the protective layer include a same material.

7. The protective window of claim 5, wherein at the edge portion of the glass substrate, a length of the protective layer is smaller than a length of the light-blocking layer.

8. The protective window of claim 7, wherein at the edge portion of the glass substrate, the length of the protective layer is equal to or less than about 0.5 millimeter.

9. The protective window of claim 1, wherein a thickness of the protective layer is about 3 micrometers to about 12 micrometers.

10. The protective window of claim 1, wherein an adhesion force between the protective layer and the adhesive layer is equal to or more than about 400 grams-force per inch.

* * * * *